US006332782B1

(12) United States Patent
Bezama et al.

(10) Patent No.: US 6,332,782 B1
(45) Date of Patent: Dec. 25, 2001

(54) SPATIAL TRANSFORMATION INTERPOSER FOR ELECTRONIC PACKAGING

(75) Inventors: Raschid J. Bezama, Mahopac; Govindarajan Natarajan, Pleasant Valley; Robert W. Pasco, Wappinger Falls, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/597,919

(22) Filed: Jun. 19, 2000

(51) Int. Cl.[7] .................................................. H01R 12/00

(52) U.S. Cl. .............................................. 439/66; 439/91

(58) Field of Search ................................ 439/65, 66, 68, 439/86, 81, 91, 482

(56) References Cited

U.S. PATENT DOCUMENTS

| 4,998,885 | 3/1991 | Beaman ................................. 439/66 |
| 5,123,852 | 6/1992 | Gillett ................................... 439/67 |
| 5,531,022 | 7/1996 | Beaman et al. ......................... 29/850 |
| 5,805,426 | * 9/1998 | Merritt et al. ......................... 361/769 |
| 5,917,707 | 6/1999 | Khandros et al. ..................... 361/776 |
| 5,926,951 | 7/1999 | Khandros et al. ..................... 29/843 |
| 5,967,804 | * 10/1999 | Yoshizawa et al. .................... 439/91 |

OTHER PUBLICATIONS

Coaxial Connector, R. E. Heath and L. K. Schultz, IBM Technical Disclosure Bulletin, pp. 3987–3988, vol. 21, No. 10, Mar. 1979.

* cited by examiner

Primary Examiner—Tulsidas Patel
(74) Attorney, Agent, or Firm—DeLio & Peterson, LLC; Kelly M. Reynolds; Margaret A. Pepper (57) ABSTRACT

An interconnect substrate structure for electrical interconnection between two electronic modules having differing conductive array parameters. The interconnect structure comprises an interposer having a top surface and a bottom surface; a first set of conductive arrays having a first conductive array parameter on the top surface, and a second set of conductive arrays having a second conductive array parameter on the bottom surface, the second conductive array and the first conductive array having differing parameters. A plurality of conductors traverses a thickness of the interposer, with the conductors comprising a conductive material optionally coated with a dielectric material, the conductors having a first end at the first conductive arrays and a second end at the second conductive arrays, whereby the conductors connecting the first and second conductive arrays therein are adapted to spatially transform the differing parameters to provide an electrical interconnection. A conductive matrix surrounds the conductors. The first set of conductive arrays comprise the same conductive array parameters as a first electronic module and the second set of conductive arrays comprise the same conductive array parameters as a second electronic module.

45 Claims, 4 Drawing Sheets

SPATIAL TRANSFORMATION INTERPOSER FOR ELECTRONIC PACKAGING

RELATED APPLICATION

Aspects of the present invention are related to subject matter disclosed in co-pending application Ser. No. 09/597,906 entitled "Method and Apparatus to Manufacture an Electronic Package with Direct Wiring Pattern" by the same inventors, filed on even date herewith and assigned to the assignee of the present invention. The interposer of the present invention can be used with the electronic assembly package disclosed in the co-pending application Ser. No. 09/597,906.

BACKGROUND OF THE INVENTION

1. Field of the Invention

This invention relates to the field of electronic connectors, and in particular, to a structure and method of electrically interconnecting two electronic modules having differing conductive array parameters, wherein an interposer spatially transforms such differing conductive array parameters.

2. Description of Related Art

In surface mount technology, integrated circuits (ICs) have leads, or signal Input/Output (I/O) connections, and Power/Ground (P/G) connections which are connected to ceramics or organic packages which in turn have leads extending therefrom for connection to a printed circuit board having a corresponding set of I/O connections. Such IC assemblies include, for example, single chip modules (SCM), wherein one chip is connected to a single chip module, or multi-chip module (MCM), wherein more than chip is connected to an organic or ceramic package containing multi-layers of thick-film or thin-film circuitry separated by dielectric layers and interconnected by vias. The electrical attachment of the IC to the package resulting in an IC package is often referred to as the first level of attachment. In this attachment level, P/G and I/O connections exist on surfaces of both IC dies and first level packaging. Such connections terminate in conductive pads or fingers which are used to connect both components using solder balls (C4), or wirebonds. The resultant assembly is often referred to as an IC package.

The electrical attachment of the IC package to the board is the second level of attachment. In second level attaching, I/O connections exist on surfaces of both IC packages and circuit boards. Such connections terminate in conductive leads, pins, wires, pads, balls, fingers, and any other mating system known in the art, thereby connecting the IC package to a circuit board for receiving, generating or continuing an electrical interconnection. Typically, the second level electrical attachment of two electronic modules using the above connection terminals is achieved by a variety of methods as disclosed in the prior art, such as wire bonding, Pin Grid Arrays (PGAs), Ball Grid Arrays (BGAs), Column Grid Arrays (CGAs), coaxial interconnect devices, elastomeric interconnect devices, and the like. A variety of such prior art discloses not only connecting the IC package to the board, but also assisting in the absorption of the difference in Coefficient of Thermal Expansion (CTE) between the package and the circuit board. However, even with such disclosed attachment means, a large CTE mismatch can still cause failure at various sites in the attachment when the first level packaging is made from a ceramic or metal composite.

The use of interposers is known and used in the art to interconnect two substrates, thereby providing an electrical interconnection between such substrates. For example, the prior art discloses the use of interposers in a first level attachment between an IC and an electronic package module. An interposer generally comprises an insulating layer and a plurality of column-like electrical conductors disposed through the insulating layer, wherein the insulating layer protects the conductive arrays. The column-like conductors have two ends for attaching to conductive arrays. Therein, the ends of the column-like conductors provide electrical connections between corresponding conductive arrays of two electronic modules on opposite sides of the interposer. When the corresponding conductive arrays have differing pitch, the interposer will typically include one or more x-y redistribution layers internally to provide the required x-y transformation function. Generally, it is difficult to provide an array of interconnecting signal lines with tightly controlled line impedance capable of operating with low noise at high frequency, such as above 500 MHz.

As disclosed in the prior art, interposers may comprise a material with the same CTE as the conductive arrays, thereby favorably altering the stress and/or strain distribution between two electronic modules. In such disclosures as electrical currents heat up the electronic module the conductive arrays will not stress as severely as they would if they were directly bonded to a material that had a substantially different CTE. Alternatively, the interposer may be comprised of a material with a CTE that is intermediate in value between that of the IC package and the board such that the strain associated with the lateral displacement of the IC package and the board is spread out over two sets of conductive arrays on the top and bottom of the interposer structure. While interposers have been disclosed in the prior art in both first and second level attachments, there is no known interposer for a first or second level attachment of two electronic modules having the same number of arrays in corresponding array grids but differing parameters of such conductive arrays, such as pitch, size, shape, array type, and combinations thereof, and without at least one such x-y redistribution layer.

Currently, the trend for IC chips is to increase the density and number of I/O connectors on a die, thereby increasing the number of I/O connections at both first and second level attachments. Such trends furthermore result in IC packages and boards with conductive connector arrays of different size, shape, pitch, and connector type. Since the board fabrication technology can not easily increase the I/O array density, any increase in I/O count is accommodated by an increase in the dimensions of the I/O connector array of the board required to interconnect in a second level attachment, the first level package is then used to transform the high density I/O connection of the IC into the low density I/O connection of the board. In parallel, the first level package can accommodate an increase in I/O count by increasing the number of x-y redistribution layers in the package, and by increasing its size to match the increased dimensions of the I/O connection array on the board. When the first level package CTE is different than the CTE of the second level package, any increase in the size of the first level package size will result in an increased mechanical stress level of the assembly, consequently resulting in decreased product reliability. The above methods of attaching two electronic modules having differing array size, shape, pitch, and the like, with increased I/O count, leads to increased production costs, increased size of the resulting second level attachment, and decreased reliability.

As the trends continue for IC packages having increased density, number of ICs on a package, increased number of I/O connections at the first and second level of attachment, and differing I/O conductive connection array size, shape, pitch, connector type, and the like, the demand continues for improvements in connecting electronic modules in surface mount technology. An ideal first or second level connection scheme is an interconnect structure that would provide the ability to directly connect two electronic modules having differing I/O conductive connector array parameters such as size, shape, pitch, and connector type, be compatible with the fabrication for a variety of conductive arrays, have a simple mechanical structure such that it can be easily and inexpensively manufactured, have a high processing yield, produce a decrease in the size of the resultant surface mount package, and be consistently reliable. Furthermore, such an interconnect structure would allow for high density I/O connections, controlled impedance, high signal isolation, and high reliability.

Bearing in mind the problems and deficiencies of the prior art, it is therefore an object of the present invention to provide a method of making an improved interconnection structure which attaches two electronic modules at a first and/or second level attachment.

It is another object of the present invention to provide an improved interconnection structure with tightly controlled line impedance capable of operating with low noise at high frequency.

A further object of the invention is to provide an improved interconnection structure which attaches two electronic modules having differing I/O array parameters.

It is yet another object of the present invention to provide an improved interconnection structure which allows for high density I/O connections.

Another object of the invention is to provide an improved interconnection structure which allows for improved, high signal isolation.

Another object of the invention is to provide an improved interconnection structure which produces a decrease in the size of the resultant surface mount package.

It is yet another object of the present invention to provide an improved interconnection structure which decreases production costs at the second level attachment.

Another object of the invention is to provide x-y translation without the use of x-y redistribution layers.

Still another object of the invention is to provide an improved interconnection structure having increased yield and reliability.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, an interconnect substrate for electrically connecting two electronic modules comprising an interposer having a first and second conductive array grids, with the first and second conductive array grids having differing conductive array parameters. The interconnect substrate also includes a plurality of conductors comprising a conductive material, with the conductors traversing a thickness of the interposer thereby spatially transforming the differing parameters by connecting the first conductive array grid to the opposing, differing second conductive array grid and providing an electrical interconnection; and a conductive matrix surrounding the plurality of conductors. The differing parameters may comprise differing array pitch measurements, differing array shape, or differing array size.

The conductors may comprise a metal selected from the group consisting of copper, tungsten, molybdenum, aluminum and gold. The interconnect substrate may include a non-conductive material coating the conductors of the conductive matrix. The first and second conductive array grids may have an equal number of arrays. Preferably, the plurality of conductors traverse a thickness of the interposer, with the conductors forming a plurality of angles with a top portion and a bottom portion of the interposer. The plurality of conductors may comprise a plurality of conductive wires, preferably having the same impedance, or a plurality of conductive coaxial wires. The interposer may be a conductive interposer made from conductive material such as conductive polymer, inorganic composite or metal, or may be a non-conductive interposer made from a nonconductive material. Preferably, the interposer comprises a material having a coefficient of thermal expansion corresponding to the coefficient of thermal expansions of an IC package and a board when the interconnect substrate is used to connect an IC package to a board. In use, the interposer is positioned between two electronic modules, with the two electronic modules having receiving conductive array connections corresponding to the first and second conductive array grids on opposing sides of the interposer.

In a related aspect, the present invention provides an interconnect substrate structure for electrical interconnection between two electronic modules having differing conductive array parameters. The interconnect structure comprises an interposer having a top surface and a bottom surface; a first set of conductive arrays having a first conductive array parameter on the top surface, and a second set of conductive arrays having a second conductive array parameter on the bottom surface, the second conductive array and the first conductive array having differing parameters. A plurality of conductors traverse a thickness of the interposer, with the conductors comprising a conductive material and optionally coated with a dielectric material, the conductors having a first end at the first conductive arrays and a second end at the second conductive arrays, whereby the conductors connecting the first and second conductive arrays therein are adapted to spatially transform the differing parameters to provide an electrical interconnection. A conductive matrix surrounds the conductors.

Preferably, the first conductive array parameter corresponds to the same conductive array parameter on a first electronic module and the second conductive array parameter corresponds to the same conductive array parameter on a second electronic module.

Said conductive material may comprise a conductive wire, a coaxial wire or a via filled with conductive material. The coating of dielectric material may be an organic polymer, polyimide, polyester, alumina, glass or inorganic powder filled polymer. The plurality of conductors preferably form angles with top and bottom surface of the interposer.

In another aspect, the present invention provides a method of fabricating an interconnect substrate for electrically connecting two electronic modules comprising providing an interposer having a first and second conductive array grids, wherein the first and second conductive array grids have differing conductive array parameters. The method then provides a plurality of conductors comprising a conductive material, wherein the conductors traverse a thickness of the interposer thereby spatially transforming the differing parameters by connecting the first conductive array grid to the opposing, differing second conductive array grid thereby providing an electrical interconnection. Finally, the method provides a conductive matrix surrounding the plurality of conductors.

In yet another, related aspect, the present invention provides a method of fabricating an interposer comprising providing an interposer having a top surface and a bottom surface, providing a first set of conductive arrays having a first conductive array parameter on the top surface, and providing a second set of conductive arrays having a second conductive array parameter on the bottom surface, the second conductive array and the first conductive array having differing parameters. The method then includes determining a spatial transformation between the differing parameters of the first and second conductive arrays, and forming a plurality of conductors traversing a thickness of the interposer, the conductors having a first end at first conductive arrays and a second end at the second conductive arrays, the conductors connecting the first and second conductive arrays therein, spatially transforming the differing parameters to provide an electrical interconnect structure. The method then includes connecting the first and second substrates by providing between the first and second substrates the interconnect structure, the interconnect structure spatially transforming and connecting the first and second sets of contact pads thereby providing an electrical interconnection between the first and second substrates having differing sets of contact pads.

The interconnect structure may be formed having top and bottom portions thereon, with the top portion having the first conductive array grid and the bottom portion having the second conductive array grid. Forming of the interposer may be by injection molding. Forming the conductors may be with a removable material, wherein subsequent to removal the conductor is at least filled with a conductive material. The conductors may be formed with a plurality of vias, a plurality of conductive wires or a plurality of conductive coaxial wires traversing through the interposer. Said plurality of conductors preferably form a plurality of angles with the top and bottom surfaces of the interposer. Said interposer may be formed prior or subsequent to formation of the conductors.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1–7 of the drawings in which like numerals refer to like features of the invention. Features of the invention are not necessarily shown to scale in the drawings. Numerous embodiments of the present invention are possible, including the embodiments described below.

The present invention comprises an interposer and a method of making the same which provides an electrical interconnection between two electronic modules having the same number of I/O arrays but differing conductive array parameters. Such conductive array parameters are defined as I/O array pitch, size, shape, and type of array, such as conductive leads, pins, wires, pads, balls, fingers, or any other mating system known in the art, and combinations thereof. Such electronic module interconnections include, for example, an IC package to a circuit board, wherein the IC package may comprise a SCM, MCM, or an IC die to a first or second level package. In the interposer of the present invention, a plurality of conductors traverse through the body of the interposer to provide an interconnection between two electronic modules having the same number of I/O conductive connector arrays on corresponding conductive array grids but differing array parameters. Such conductive arrays further comprise a conductive wire, which is optionally surrounded by a dielectric coating, wherein the plurality of conductors are at least surrounded by a conductive matrix.

The plurality of conductors have a first end which correlates with a first conductive array grid and a second end which correlates with a second conductive array grid. Preferably, the first conductive array grid is on a top surface of the interposer and the second conductive array grid is on a bottom surface of such interposer. In a preferred embodiment, the number of arrays on the first and second conductive array grids are equal but the conductive array parameters of such first and second array grids differ. Typically, the prior art discloses solving such interconnecting problems by adding x-y redistribution layers to the first level package which provide the needed x-y translation, thereby matching the IC array pitch to the board array pitch. Alternatively, the prior art discloses decreasing the size of the board connecting array pitch, when the existing board fabrication allows the same, thereby matching the array pitch of the board to that of the IC. Such prior art methods lead to increased production costs.

The present invention avoids the use x-y redistribution layers, as well as avoids decreasing the size of the board connecting array pitch. The interposer of the present invention spatially transforms the differing conductive array parameters of two electronic modules. The inventive interposer provides a plurality of substantially straight column-like conductors connected to a first conductive grid array, which are then attenuated, in substantially the shortest distance possible, to form a substantially straight conductor connection to a corresponding number of arrays in a second conductive array grid. During the formation of the straight conductor interconnections, such conductors are extrapolated through the body of the interposer thereby forming angles with the top and bottom surfaces of the interposer. As the difference of conductive array parameters of corresponding arrays on the first and second conductive array grids increase, the angle of the conductor with the top and bottom surface of the interposer structure becomes more defined, therein creating a smaller angle and ultimately limiting the maximum difference between both conductive array grids. A practical maximum difference, determined by geometric evaluation, may be, for example, 100%, i.e. the layer array grid has twice the pitch of the smaller array grid.

The interposer of the present invention is provided between two electronic modules, wherein one electronic module has substantially the same conductive array grid and parameters for receiving, generating or continuing an electrical interconnection with the first conductive array grid on the interposer, and the other electronic module has substantially the same conductive array grid and parameters for receiving, generating or continuing an electrical interconnection with the second conductive array grid on the interposer. Such electrical attachment may be achieved by a variety of methods as known and used in the art, including wire bonding, Pin Grid Arrays (PGAs), Ball Grid Arrays (BGAs), Column Grid Arrays (CGAs), solder balls, coaxial interconnect devices, elastomeric interconnect devices, and the like, for example.

FIGS. 1–5 illustrate one embodiment of the interposer 10 of the present invention, wherein interposer 10 comprises a defined shape. Interposer 10 may comprise a plurality of shapes, such as, a cube, a sheet, and a disk, for example. Interposers typically comprise a matrix material whose structure and thickness render it stiff enough to be processed using conventional semiconductor fabrication techniques and to permit registration to previously patterned features. The interposer 10 of the present invention may comprise a conductive or non-conductive matrix material including, for example, a conductive or non-conductive plastic, a ceramic, a metal, or a composite. Preferably, interposer 10 is made from a conductive material, such as, conductive polymer, conductive inorganic composite or metal. Traversing through the body of the interposer 10 is a plurality of conductors 42, wherein such plurality of conductors 42 consist of a conductive material, such as an electrical wire 46, which optionally may be electrically isolated from the interposer matrix 40 by a non-conductive material coating, such as a dielectric coating 48. The dielectric material may be an organic polymer, polyimide, polyester, alumina, glass, or an inorganic powder filled polymer. Where the potential of the connectors equals the potential of the conductive matrix 40, such connectors do not require the dielectric coating 48.

Figure 1:
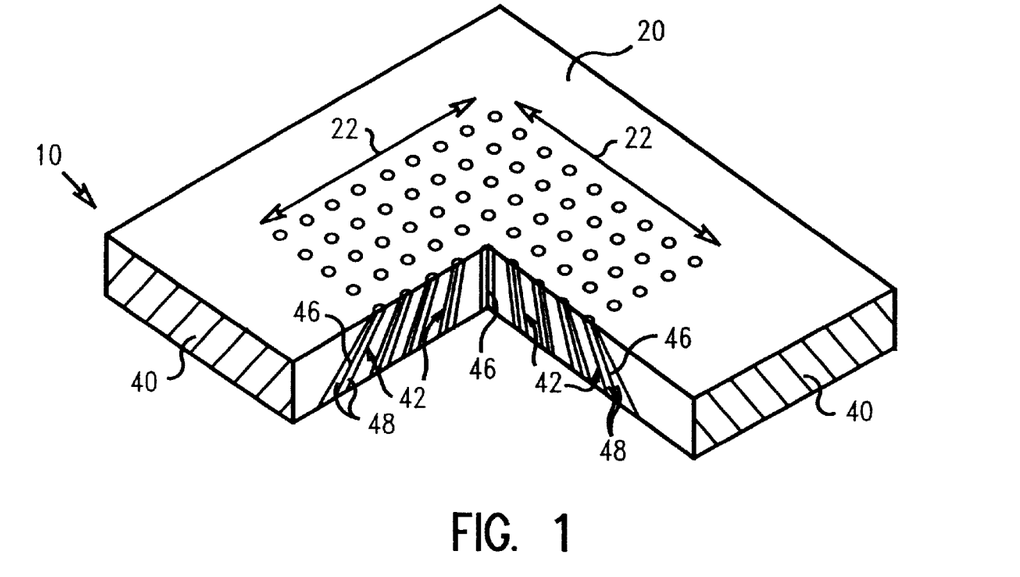
FIG. 1 is a top partial perspective view of an interposer of the present invention, partially cut away, showing a first conductive array grid.
Figure 2:
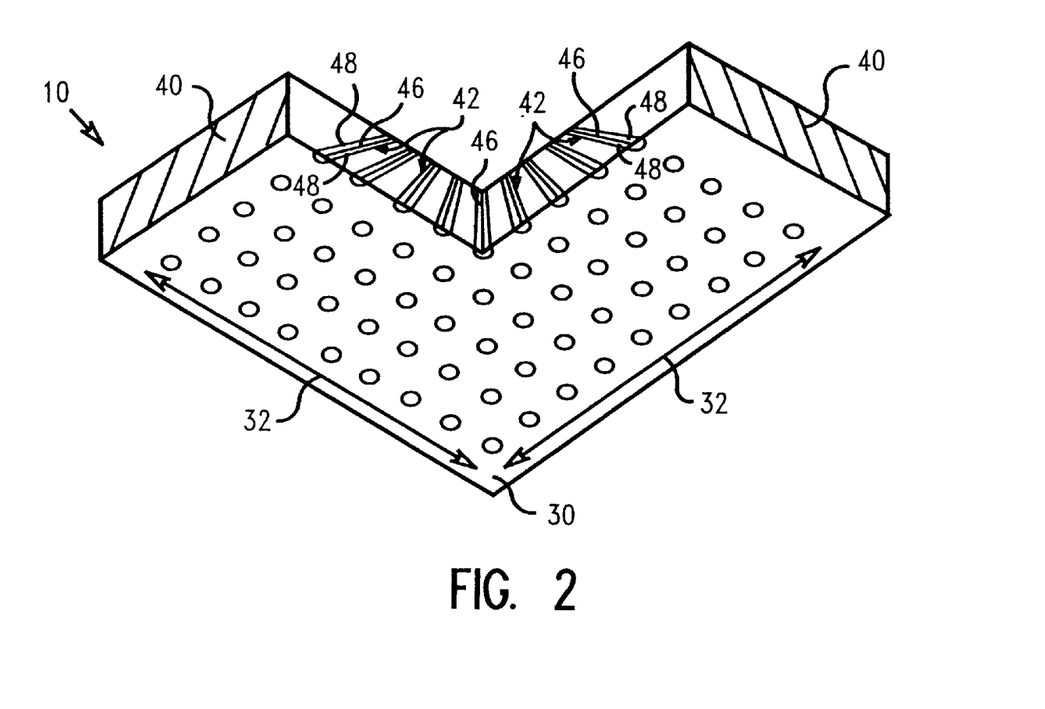
FIG. 2 is a bottom partial perspective view of the interposer of FIG. 1, partially cut away, showing a second conductive array grid.
Figure 3:
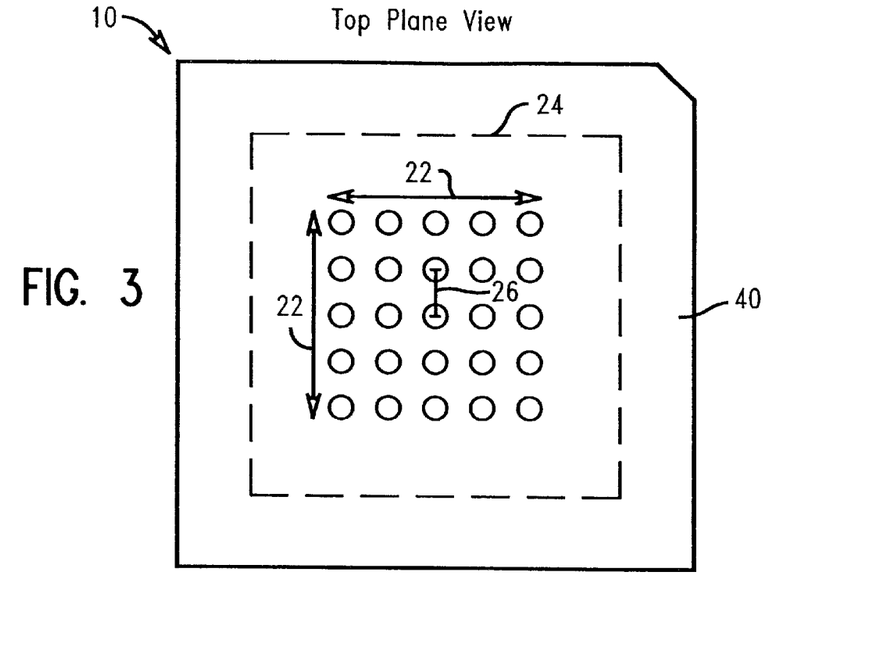
FIG. 3 shows a top plan view of the interposer of FIG. 1 illustrating the first conductive array grid having a first conductive array parameter, more specifically, a first pitch.
Figure 4:
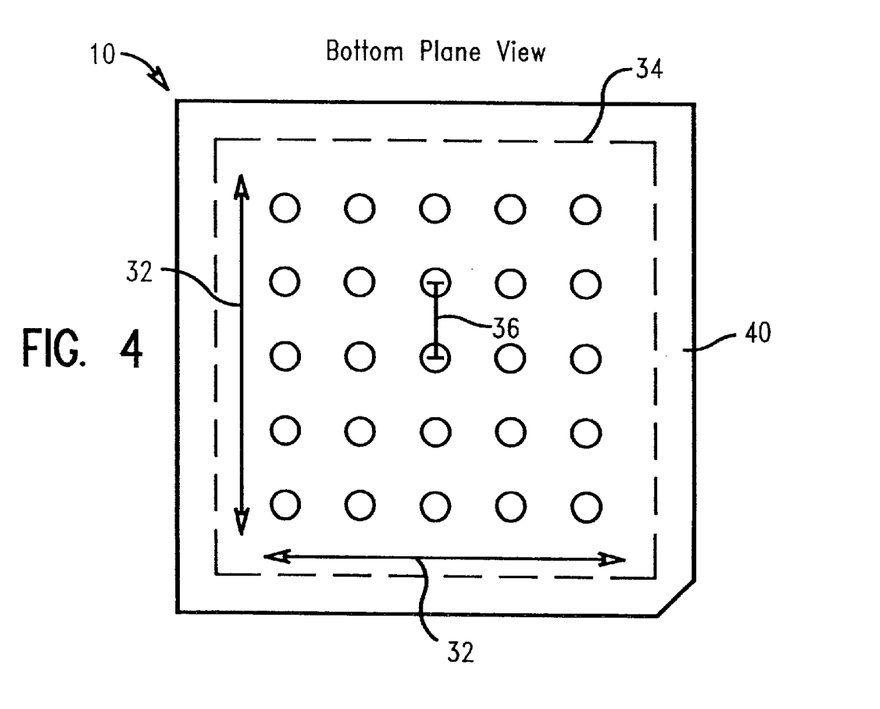
FIG. 4 shows a bottom plan view of the interposer of FIG. 1 illustrating the second conductive array grid having a second conductive array parameter, more specifically, a second pitch.

In FIG. 1 there is shown a top partial perspective view of the interposer 10 showing a first conductive array grid. On a top surface 20 of the interposer 10 is a first set of a plurality of I/O conductive arrays which forms a first conductive array grid 22. Such first conductive array grid 22 comprises a determinable number of conductive arrays, each spatially located on the top surface 20. FIG. 2 illustrates a bottom partial perspective view of interposer 10 showing a second conductive array grid 32 on a bottom surface 30 of interposer 10. Such second I/O conductive array grid 32 also comprises a determinable number of conductive arrays, each spatially located on the bottom surface 30 of the interposer 10. Preferably, the number of conductive arrays of the first conductive array grid 22 and the second conductive array grid 32 are equal, for example, both grids may comprise 10×10 arrays; however, the parameters of the arrays may differ, such as differing pitch, for example. For ease of viewing and understanding a preferred embodiment of the present invention, circles illustrate the conductive arrays which form first and second conductive array grids 22 and 32. Furthermore, FIGS. 3 and 4 show a top and bottom plan view, respectively, of interposer 10. FIG. 3 illustrates the first conductive array grid 22 within a first dashed line 24 on the top surface 20 of interposer 10. FIG. 4 illustrates the second conductive array grid 32 within a second dashed line 34 on the bottom surface 30 of interposer 10. Such arrays may comprise various shapes, sizes, and varieties or types, such as leads, conductive leads, pins, pads, balls, fingers, and the like, or combinations thereof.

As illustrated in FIGS. 3 and 4, first and second conductive array grids, 22 and 32, have the same number of conductors with differing parameters. Illustrated as an example of differing parameters, within the dashed line 24 of FIG. 3 a pitch measurement 26 comprises a nominal distance from the center of one array to the center of an adjacent array in the first array grid 22. On the opposite, parallel side of the interposer 10, a second pitch measurement 36 is illustrated within the dashed line 34, as shown in FIG. 4. Pitch measurement 36 comprises a second nominal distance from the center of one array to the center of an adjacent array in the second array grid 32. In one embodiment of the present invention, the two pitch measurements are not equal; however, such is not a requirement. Pitch measurement 26 of the distance between array to array on the top surface 20 of interposer 10 may be, for example, smaller than the pitch measurement 36 of the distance between array to array on the bottom surface 30 of interposer 10. In such an embodiment of the present invention, conductive array grid 32 are distributed more broadly over the bottom surface 30 in comparison to the distribution of arrays of conductive array grid 22 on the top surface 20.

Figure 5:
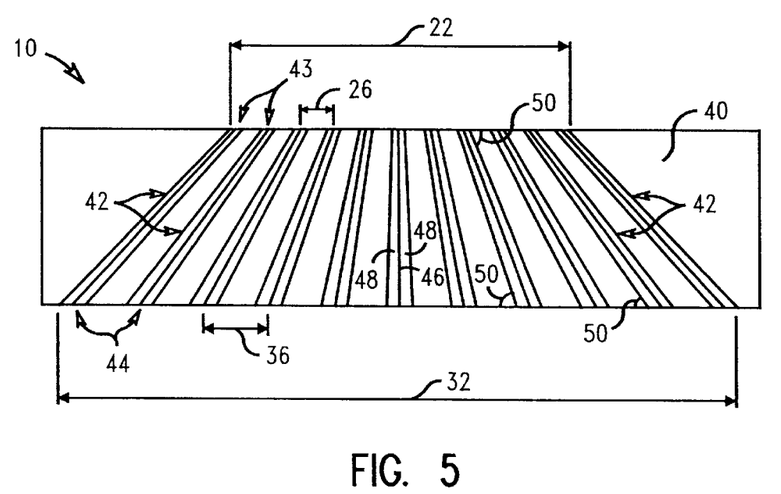
FIG. 5 shows an elevational cross-sectional view of the interposer of FIG. 1 demonstrating the spatial transformation of providing an electrical connection from the first conductive array grid to the second conductive array grid.
Figure 6:
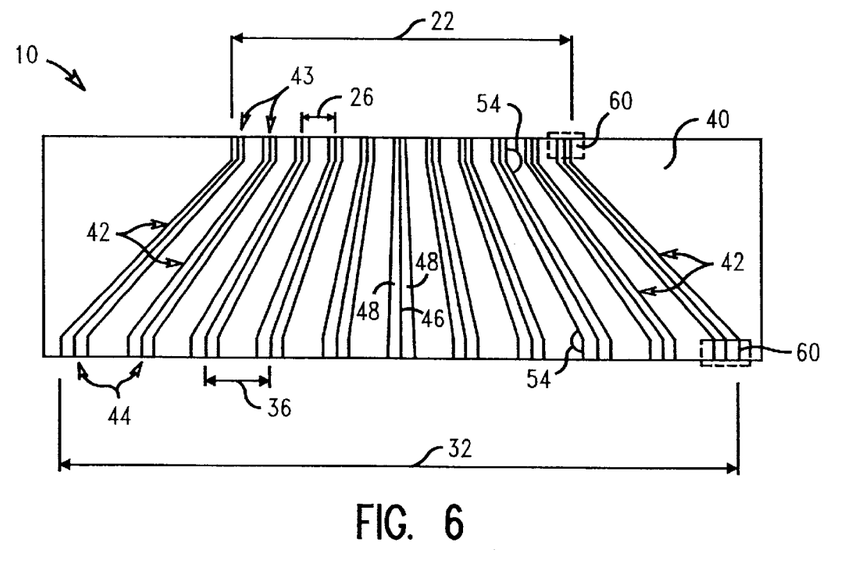
FIG. 6 shows an elevation cross-sectional view of an alternate embodiment of the interposer of FIG. 5.

FIGS. 5 and 6, showing cross-sectional views of the interposer 10, illustrate the plurality of conductors 42 forming a spatial transformation of a conductive array parameter, such as pitch, from the first conductive array grid 22 to the second conductive array grid 32. As illustrated the plurality of conductors 42 traverse a thickness of the interposer 10. Conductors 42 comprise a conductive material, such as, copper, tungsten, molybdenum, aluminum, gold, or any other metal with high conductivity. Conductors 42 may include, for example, a conductive wire, a via filled with conductive material, a coaxial connector, and the like. In a preferred embodiment, the plurality of conductors 42 comprise a coaxial connector consisting of a center electrical wire 46, comprising a conductive material, surrounded by a protective, non-conductive dielectric layer 48 which prevents external electricity from affecting the current flowing in the center conductor. Further illustrated in FIGS. 5 and 6, the conductors 42 of the conductive matrix 40 traverse through the interposer 10. The conductors may be protected by forming a defined, solid conductive matrix 40 around and encasing the conductors, thereby the resultant matrix 40, with the encased conductors 42, forming the interposer 10. Matrix 40 may be formed by a variety of common fabrication techniques known and used in the art, including injection molding, and multi-layer ceramic processing techniques, for example.

In a preferred embodiment, the interconnection between the first and second electronic modules is formed by connecting a first end 43 of the coaxial conductors 42 to the first conductive array grid 22, wherein electrical wire 46 of the coaxial conductor has been surrounded by the protective, non-conductive dieletric layer 48 by techniques known in the art of wire fabrication. The coaxial conductors 42 are then attenuated to connect to a second end 44 which correlates with the second conductive array grid 32 having differing conductive array parameters. As a result of such connections, some conductive wiring may form a plurality of angles 50 with the top and bottom surfaces, as shown in FIG. 5. The shortest set of conductors 42 will result when the larger grid array 32 can be generated by expanding the same uniformly to the smaller grid array 22, wherein the connector assignment at the top surface matches the identical location at the bottom surface. This type of pattern expansion is desirable because it facilitates interposer manufacturing processes, hence lowering production costs. The change in angle between a conductor 42 and interposer surface, and from the center of the interposer to the edge of the interposer is a consequence of the expansion process described above, wherein the magnitude of the smallest angle will be depend on the amount of expansion between both top and bottom grid arrays and the interposer thickness.

To assemble the set of coaxial wires into the location required to make an interposer, it is necessary first to assemble all wires at the required locations given by the smaller grid array, which are held in place by mechanical means known and used in the art. The set of connectors then may be expanded to the second grid array by using mechanical means, such as those used in the industry, or by chemical means with the use of thermo-sensitive material which can expand significantly with the application of heat. The reverse process is also possible wherein the wires are assembled to match the larger connector array grid, and the smaller grid array is made either mechanically, or with the help of a shrinkable material, such as those known and used in the art. Once the wires are placed into the desired location, the conductive polymer matrix is infiltrated in the spaces between wires using conventional filling techniques. The polymer can then be cured if required.

Alternatively, and dependent upon the selected manufacturing process, as illustrated within the dashed line in FIG. 6, conductors 42 may further comprise at the first end 43 and the second end 44, a conductive connector array 60 for receiving an electronic module having a corresponding array. Connector array 60 connects perpendicularly with the top and bottom surfaces of the interposer, thereby forming a plurality of angles 54 with the conductors 42. Thereafter, the interconnect structure is formed encasing the conductive matrix, thereby resulting in the interposer.

Figure 7:
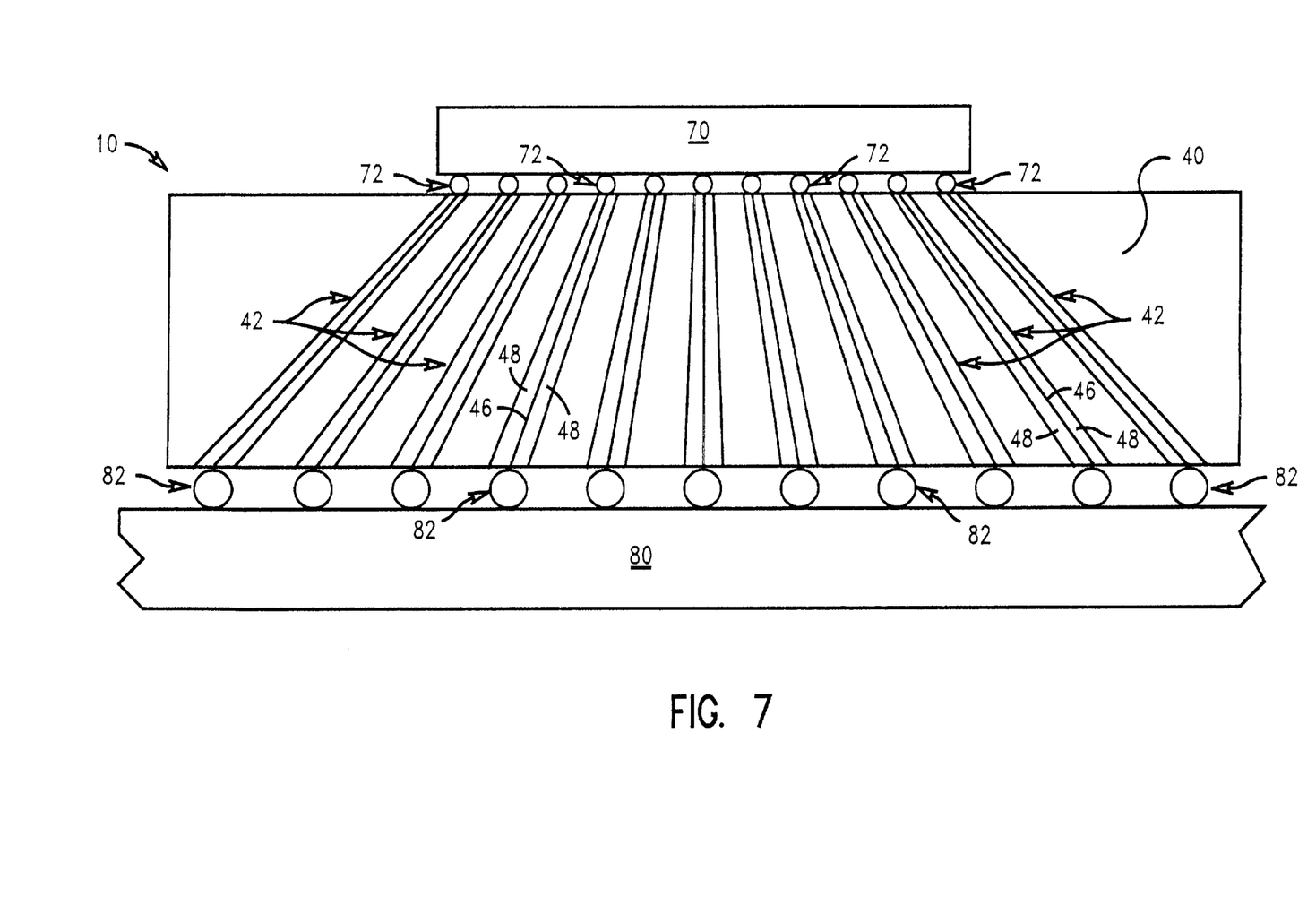
FIG. 7 shows an elevational cross-sectional view of the interposer of FIG. 5 as part of an assembled electronic module.

In another embodiment, conductors 42 may be formed after formation of the interconnect structure. A plurality of vias may be formed in the interconnect structure, wherein the vias directly connect the top surface conductive array grid to the bottom surface conductive array grid. The vias comprise first and second ends which correspond to the conductive arrays respectively on first and second electronic modules, such as a first IC package 70 and a second board 80, thereby allowing for an electrical interconnection between such first and second electronic modules, as shown in FIG. 7. The vias may formed by techniques known and used in the art, such as, photolithography, mechanical punching, precision drilling, laser ablation, or any other means which allow apertures of very small dimensions to be formed. The vias are subsequently at least filled with a conductive material such as an organic or metal powder slurry, by techniques used in the art, including silk screening or extension.

Alternatively, a removable material may be used to connect the first and second conductive array grids. Such removable material may be removed subsequent to formation of the interconnect structure to produce interposer 10 having vias traversing therethrough. The empty vias are then at least filled with a conductive material by techniques described above.

Once the interposer 10 has been fabricated, finishing of such interposer is performed by conventional means known and used in the art, such as by forming connection joints, capping, and the like. Interposer 10 may then be placed between and mechanically attach two electronic modules in a first and/or second level attachment. For example, the interposer may be placed between a board 80 and an IC package 70, having a chip(s) attached to either an MCM or SCM, for a second level attachment by methods used in the art. Thereby the interposer electrically interconnects the conductive arrays of the IC package 70 connected to the top surface of the interposer 10 to the conductive arrays of the board 80 connected to the bottom surface of the interposer 10. See FIG. 7. In the above attachment, the IC package 70 is connected to the first conductive array grid by interconnection means 72 using techniques known in the art. Board 80 is connected to the second conductive array grid by interconnection means 82 using the above techniques. The assembly can be then be thermally reflowed to allow for the interposer 10 to provide an electrical interconnection between the IC package 70 and the board 80 having the same number of arrays but differing pitch of such array.

For example, a 33 mm ceramic SCM package, having a 1532 I/O pin array with an 0.80 mm pitch, may be connected to a conventional 50 mm plastic board having a 1532 I/O pin array with an 1.27 mm pitch. Thus, the SCM package and the circuit board have the same I/O pin array but differing pitch. The interposer of the present invention spatially transforms the 0.80 mm pitch of the package to connect with the 1.27 mm pitch of the board, thereby providing an electrical interconnection between the two electronic modules. Without the use of the interposer of the present invention, the size of the 33 mm ceramic package would have to be increased to the size of the circuit board, 50 mm, or alternatively, the pitch size of the board would have to be decreased, to allow for electrical connectivity of the package with the board. Typically, the resultant electronic package may short out if interconnection terminals 72 and 82 contact each other. Interposer 10 prevents such shorting out by prohibiting contact between interconnection terminals 72 and 82. Furthermore, interposer 10 prevents over compression of the interconnection terminals by acting as a stand off between the IC package 70 and the board 80.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An interconnect substrate for electrically connecting two electronic modules having differing conductive array parameters comprising:
an interposer having first and second conductive array grids, said first and second conductive array grids having differing conductive array parameters selected from the group consisting of differing array shape, array size, type of array, and combinations thereof;

a plurality of conductors comprising at least a conductive material surrounded by a non-conductive material, said conductors traversing a thickness of said interposer whereby said non-conductive material has a radial thickness changing as said conductors traverse through said interposer to spatially transform said differing conductive array parameters to connect the first conductive array grid to an opposing second conductive array grid having said differing conductive array parameters for providing an electrical interconnection therebetween; and a matrix surrounding said plurality of conductors, whereby said interposer having said non-conductive material with said radial thickness changing there-through said interposer spatially transforms said differing conductive array parameters of said two electronic modules to electrically connect the electronic modules when provided therebetween.

2. The interconnect substrate of claim 1 wherein said non-conductive material surrounding said conductive material of the conductors comprises a dielectric coating.

3. The interconnect substrate of claim 1 wherein said matrix of said interposer comprises a conductive matrix.

4. The interconnect substrate of claim 1 wherein said interposer comprises a non-conductive interposer made from a non-conductive material.

5. The interconnect substrate of claim 1 wherein said first and second conductive array grids have an equal number of arrays.

6. The interconnect substrate of claim 1 wherein said differing conductive array parameters further include differing array pitch measurements in combination with said differing conductive array parameters selected from the group consisting of differing array shape, array size, type of array, and combinations thereof.

7. The interconnect substrate of claim 1 wherein said plurality of conductors traverse a thickness of said interposer, said conductors forming a plurality of angles with a top portion and a bottom portion of said interposer.

8. The interconnect substrate of claim 1 wherein said plurality of conductors comprise a plurality of conductive wires.

9. The interconnect substrate of claim 1 wherein said plurality of conductors comprise a plurality of conductive wires.

10. The interconnect substrate of claim 1 wherein said interposer comprises a material having a coefficient of thermal expansion corresponding to the coefficient of thermal expansions of two electronic modules when said interconnect substrate is used to connect the two electronic modules.

11. The interconnect substrate of claim 1 wherein said interposer is positioned between two electronic modules for connection, said two electronic modules having receiving conductive array connections corresponding to said first and second conductive array grids.

12. The interconnect substrate of claim 11 wherein the interposer connects two electronic modules in a first level attachment.

13. The interconnect substrate of claim 11 wherein the interposer connects two electronic modules in a second level attachment.

14. The interconnect substrate of claim 1 wherein said conductors comprise a conductive material selected from the group consisting of copper, tungsten, molybdenum, aluminum and gold.

15. The interconnect substrate of claim 1 wherein said type of array includes arrays selected from the group consisting of leads, pins, wires, pads, balls, fingers, and combinations thereof.

16. An interconnect substrate structure for electrical interconnection between two electronic modules having differing conductive array parameters comprising:

an interposer having a top surface and a bottom surface;

a first set of conductive arrays having a first conductive array parameter on said top surface, a second set of conductive arrays having a second conductive array parameter on said bottom surface, said second conductive array and said first conductive array having differing conductive array parameters selected from the group consisting of differing array shape, array size, type of array, and combinations thereof;

a plurality of conductors traversing a thickness of said interposer, said conductors comprising at least a conductive material surrounded by a non-conductive material, said conductors having a first end at said first conductive arrays and a second end at said second conductive arrays, whereby said non-conductive material of said conductors has a radial thickness changing as said conductors traverse through said interposer to connect said first and second conductive arrays by spatially transforming the differing conductive array parameters of said first and second conductive array grids for providing an electrical interconnection therebetween; and a matrix surrounding said conductors, whereby said interposer having said non-conductive material with said radial thickness changing there-through said interposer spatially transforms said differing conductive array parameters of said two electronic modules to electrically connect the electronic modules when provided therebetween.

17. The interconnect substrate of claim 16 wherein said interposer comprises a non-conductive interposer made from a non-conductive material.

18. The interconnect substrate of claim 16 wherein said interposer comprises a conductive interposer made from conductive material.

19. The interconnect substrate of claim 18 wherein said interposer comprises a conductive material selected from the group consisting of conductive polymer, inorganic composite, and metal.

20. The interconnect substrate of claim 16 wherein said first and second conductive array grids have an equal number of arrays.

21. The interconnect substrate of claim 16 wherein said plurality of conductors traversing a thickness of said interposer, said conductors form a plurality of angles with a top portion and a bottom portion of said interposer.

22. The interconnect substrate of claim 16 wherein said plurality of conductors comprise a plurality of conductive wires.

23. The interconnect substrate of claim 16 wherein said plurality of conductors comprise a plurality of wires.

24. The interconnect substrate of claim 16 wherein said plurality of conductors traversing a thickness of said interposer comprise a plurality of vias filled with conductive material isolated from the interposer by a non-conductive material.

25. The interconnect substrate of claim 16 wherein said non-conductive material is selected from the group consisting of an organic polymer, polyimide, polyester, alumina, glass, and inorganic powder filled polymer.

26. The interconnect substrate of claim 16 wherein said first conductive array parameter corresponds to a conductive array parameter on a first electronic module at the first end of the conductors.

27. The interconnect substrate of claim 16 wherein said second conductive array parameter corresponds to a conductive array parameter on a second electronic module at the second end of the conductors.

28. The interconnect substrate of claim 16 wherein said interposer is positioned between two electronic modules, said two electronic modules having receiving conductive array parameter connections corresponding to said first and second conductive array parameters.

29. The interconnect substrate of claim 16 wherein said differing conductive array parameters further include differing array pitch measurements in combination with said differing conductive array parameters selected from the group consisting of differing array shape, array size, type of array, and combinations thereof.

30. The interconnect substrate of claim 16 wherein said type of array includes arrays selected from the group consisting of leads, pins, wires, pads, balls, fingers, and combinations thereof.

31. A method of fabricating an interconnect substrate for electrically connecting two electronic modules having differing conductive array parameters comprising:
   forming an interposer having first and second conductive array grids on first and second surfaces of said interposer respectively, said first and second conductive array grids have differing conductive array parameters selected from the group consisting of differing array shape, array size, type of array, and combinations thereof;
   providing said interposer with a plurality of conductors comprising at least a conductive material surrounded by a non-conductive material, said conductors traversing a thickness of said interposer whereby said non-conductive material has a radial thickness changing as said conductors traverses through said interposer to spatially transform said differing conductive array parameters by connecting a first conductive array parameter of the first conductive array grid on the first surface of said interposer to the opposing, differing second conductive array parameter of the second conductive array grid on the second surface of said interposer for providing an electrical interconnection therebetween,
   whereby said interposer having said non-conductive material with said radial thickness changing there-through said interposer spatially transforms the differing conductive array parameters of the two electronic modules to electrically connect the electronic modules having differing conductive array parameters when provided therebetween.

32. The method of claim 31 wherein said non-conductive material of said conductors separates said conductive material of the conductors from said conductive interposer matrix.

33. The method of claim 31 wherein said interposer is formed having top and bottom portions, thereon said top portion having said first conductive array grid and said bottom portion having said second conductive array grid.

34. The method of claim 31 wherein said first conductive array parameter corresponds to a conductive array parameter on a first electronic module at the first end of the conductors.

35. The method of claim 31 wherein said second conductive array parameter corresponds to a conductive array parameter on a second electronic module at the second end of the conductors.

36. The method of claim 31 wherein the step of forming the conductors further comprises forming a plurality of vias traversing through said interposer.

37. The method of claim 31 wherein the step of forming the conductors comprises forming said conductors using a removable material, wherein subsequent to formation of said interposer, said removable material is removed and subsequently at least filled with a conductive material.

38. The method according to claim 31 wherein said conductors comprise a plurality of conductive wires.

39. The method according to claim 31 wherein said conductors comprise a plurality of conductive wires.

40. The method according to claim 31 wherein said plurality of conductors traverse a thickness of said interposer, said conductors forming a plurality of angles with a top portion and a bottom portion of said interposer.

41. The method according to claim 31 wherein said interposer is formed subsequent to formation of said conductors.

42. The method of claim 31 wherein said interposer is positioned between two electronic modules having receiving conductive array parameter connections corresponding to said first and second conductive array parameters of said first and second array grids, thereby electrically connecting said two electronic modules to each other.

43. The interconnect substrate of claim 31 wherein said differing conductive array parameters further include differing array pitch measurements in combination with said differing conductive array parameters selected from the group consisting of differing array shape, array size, type of array, and combinations thereof.

44. The interconnect substrate of claim 31 wherein said type of array includes arrays selected from the group consisting of leads, pins, wires, pads, balls, fingers, and combinations thereof.

45. A method of fabricating an electronic assembly having an interconnect substrate for electrically connecting two electronic modules comprising:
   providing first and second electronic modules having differing first and second conductive array parameters respectively, wherein said differing first and second conductive array parameters of said first and second electronic modules are selected from the group consisting of differing array shape, array size, type of array, and combinations thereof;
   determining a spatial transformation between said differing first and second conductive arrays parameters of said first and second electronic modules;
   forming an interposer having a top surface and a bottom surface, said top surface of said interposer being provided with a first set of conductive arrays having a conductive array parameter corresponding to said first conductive array parameter of said first electronic module while said bottom surface of said interposer is provided with a second set of conductive arrays having a conductive array parameter corresponding to said second conductive array parameter of said second electronic module, said second conductive array and said first conductive array of said interposer having differing parameters;
   spatially transforming said first and second conductive arrays of said interposer by providing a plurality of conductors traversing a thickness of said interposer, said conductors comprising at least a conductive material surrounded by a dielectric material, said conductors having a first end at said first conductive arrays and a second end at said second conductive arrays, whereby said dielectric material has a radial thickness changing as said conductors traverse through said interposer to connect said first and second conductive arrays of said interposer thereby spatially transforming said first and second conductive arrays parameters of said first and second electronic modules based on said determined spatial transformation to provide an electrical interconnection therebetween said first and second electronic modules; and providing a matrix surrounding said plurality of conductors.

* * * * *

UNITED STATES PATENT AND TRADEMARK OFFICE
CERTIFICATE OF CORRECTION

PATENT NO. : 6,332,782 B1
DATED : December 25, 2001
INVENTOR(S) : Bezama et al.

It is certified that error appears in the above-identified patent and that said Letters Patent is hereby corrected as shown below:

Column 8,
Line 64, insert paragraph:

-- In accordance with the present invention, the protective, non-conductive dielectric layer 48 of each of the conductors 42 has a radial thickness which changes as the non-conductive dielectric layer 48 traverses through the interposer 10. In particular, the partial perspective views of the first and second conductive array grids in Figs. 1 and 2, respectively, show the coaxial conductors 42 having a first radial thickness or diameter at the first conductive array grid 22 on the top surface 20 and a differing, second radial thickness or diameter at the second conductive array grid 32 on the bottom surface 30. As the coaxial conductors 42 traverse through the body of the interposer from the top surface 20 to the opposing, second surface 30 of the interposer, the radial thickness or diameter of the non-conductive dielectric layer 48 of the coaxial conductors 42 gradually changes in dimension, thereby gradually changing the overall radial thickness or diameter of the coaxial conductors 42. For example, as shown in Figs. 1 and 2, the non-conductive dielectric layer 48 of the coaxial conductors 42 may have a small radial thickness or diameter at the top surface 20 of the interposer whereby the radial thickness of the non-conductive dielectric layer 48 gradually increases to a larger radial thickness at the bottom surface of the interposer as the coaxial conductors 42 traverse the interposer 10. --

UNITED STATES PATENT AND TRADEMARK OFFICE
CERTIFICATE OF CORRECTION

PATENT NO.     : 6,332,782 B1
DATED          : December 25, 2001
INVENTOR(S)    : Bezama et al.

It is certified that error appears in the above-identified patent and that said Letters Patent is hereby corrected as shown below:

Column 14,
Lines 14 and 15, delete claim 39.

Signed and Sealed this

Twenty-second Day of April, 2003

JAMES E. ROGAN
*Director of the United States Patent and Trademark Office*